United States Patent [19]
Althoff et al.

[11] Patent Number: 5,610,540
[45] Date of Patent: Mar. 11, 1997

[54] LOW POWER SENSOR AMPLIFIER FOR GAIN MEMORY CELLS

[75] Inventors: Klaus Althoff, Burlington, Vt.; Wolfgang H. Krautschneider, Hoberthann, Germany; Klaus J. Lau, Essex Junction, Vt.

[73] Assignee: Siemens Aktiengesellschaft, Munich, Germany

[21] Appl. No.: 625,840

[22] Filed: Apr. 1, 1996

Related U.S. Application Data

[63] Continuation of Ser. No. 414,090, Mar. 31, 1995, abandoned.

[51] Int. Cl.⁶ ..................................................... H03F 3/45
[52] U.S. Cl. ............................... 327/51; 327/54; 327/57
[58] Field of Search ................................ 327/51, 54, 57

[56] References Cited

U.S. PATENT DOCUMENTS

| | | | |
|---|---|---|---|
| 3,932,848 | 1/1976 | Porat | 340/173 R |
| 4,434,381 | 2/1984 | Stewart | 307/530 |
| 4,567,387 | 1/1986 | Wacyk | 307/530 |
| 4,574,365 | 3/1986 | Scheuerlein | 365/149 |
| 4,970,689 | 11/1990 | Kenney | 365/189.01 |
| 5,013,943 | 5/1991 | Hirose | 327/51 |
| 5,015,890 | 5/1991 | Murakami et al. | 307/530 |
| 5,015,891 | 5/1991 | Choi | 307/530 |
| 5,138,198 | 8/1992 | Shen et al. | 307/465 |
| 5,426,385 | 6/1995 | Loi | 327/51 |

*Primary Examiner*—Margaret Rose Wambach
*Attorney, Agent, or Firm*—Adel A. Ahmed

[57] ABSTRACT

A low power sense amplifier to sense the output of any memory cell whose output may be ill-defined is especially suited for use with gain memory cells. The low power sense amplifier circuit is based on an inverter with a feedback loop with additional circuitry providing stability after signal sensing. The bit sense line is discharged before sensing and after sensing it is locked to either a logical "0" or a logical "1" corresponding to the logical value of the gain memory cell during a read cycle. The low power sense amplifier provides a logic output that is well defined with respect to the supply voltage and corresponds to the logic valve of gain memory cell. The low power sense amplifier has no bias current flow during signal sensing and no power consumption in the stand by mode. The present invention low power sense amplifier is capable of being shared by a first bit sense line and a second bit sense line. The low power sense amplifier has a relatively low component count which allows the amplifier to be capable of very fast sensing of the output signals.

20 Claims, 5 Drawing Sheets

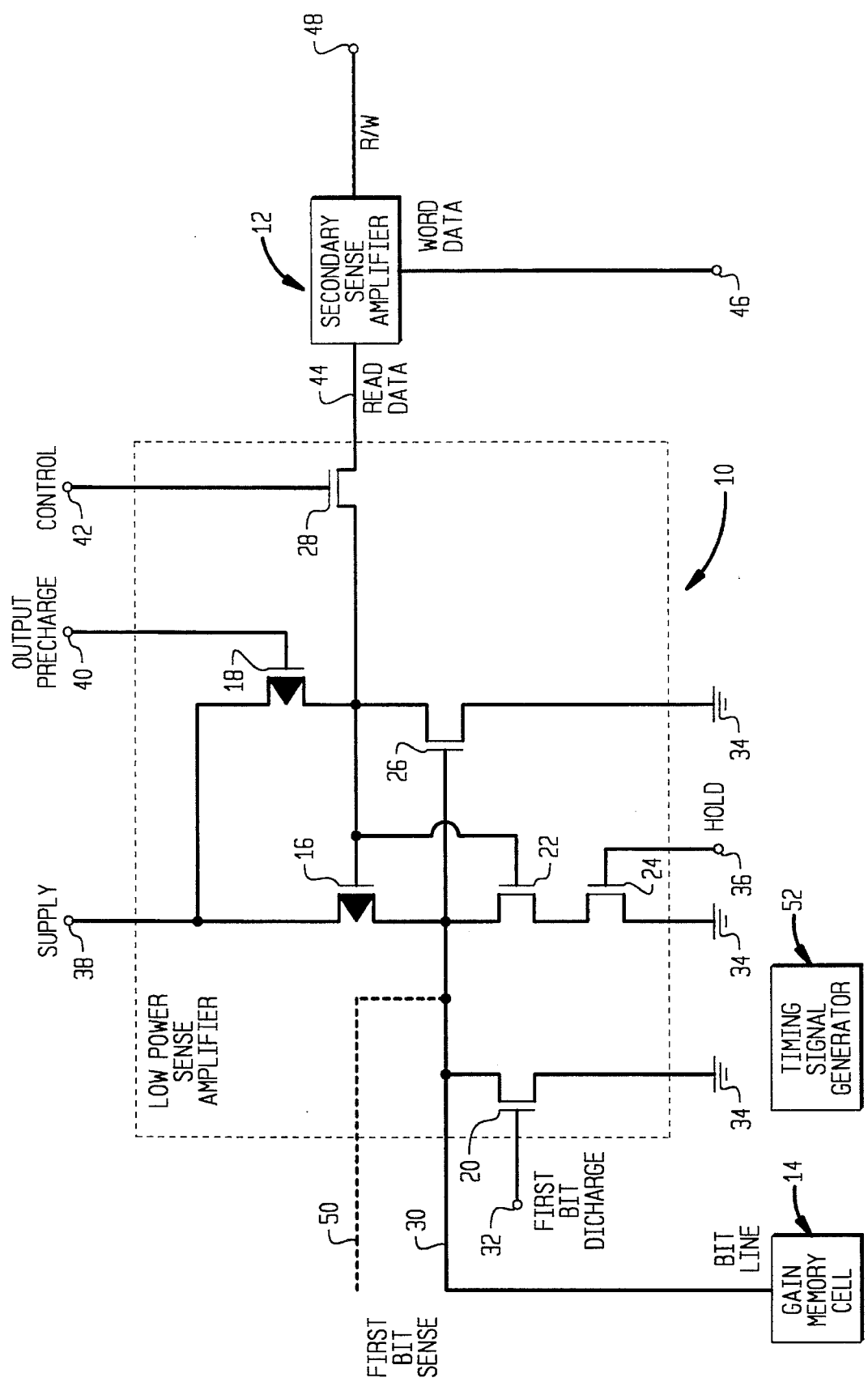

FIRST BIT DISCHARGE LINE

HOLD LINE $V_{DD}$

SUPPLY LINE 0

OUTPUT PRECHARGE LINE

CONTROL LINE

WORD LINE

LOW POWER SENSOR AMPLIFIER FOR GAIN MEMORY CELLS

CROSS-REFERENCE TO RELATED APPLICATION

This is a continuation of Ser. No. 08/414,090 filed Mar. 31, 1995 now abandoned.

FIELD OF THE INVENTION

The present invention relates to a sense amplifier for memory circuits, and more particularly to a low power CMOS sense amplifier for gain memory cells.

BACKGROUND OF THE INVENTION

The output signal from a standard memory cell provides a well defined predetermined voltage difference for both logical states which can be sensed by a standard sense amplifier. A gain memory cell differs from the standard memory cell by not having a well defined voltage difference for both logic states. The gain memory cell will deliver charge only when a logical "1" is present. The output signal from a gain memory cell cannot be sensed by a standard sense amplifier. The sense amplifier for a gain memory cell must provide a well defined output state for both logical levels "1" and "0" from a charge signal delivered only when a logical "1" is present.

In designing a sense amplifier, the potential for low-power operation is one of the attractive attributes of CMOS technology. A typical CMOS circuit application can provide very low standby power. Current flows in the circuit only when a transition of state is occurring. This feature makes it extremely easy to manage the power dissipation in CMOS designs. For an n-channel device the current carriers are electrons, whereas for a p-channel device the carriers are holes. Four separate regions or terminals exist in a MOS transistor: source, drain, gate, and substrate. For normal operation, the source, drain, and gate voltages measured with respect to substrate are positive for an n-channel device and negative for a p-channel device. The output is always connected to one of the power supply rails because at any given state only one transistor is on and the other is off. This guarantees that the logic swing will be determined by the power supply voltage only, and not by the ratio of the effective impedance of the devices, as is the case with static nMOS design.

The prior art is replete with sense amplifiers for use with memory cells. Some examples of prior art devices are as follows:

U.S. Pat. No. 3,932,848, entitled Feedback Circuit For Allowing Rapid Charging And Discharging Of A Sense Node In A Static Memory, issued to E. Porat, discloses an n-channel sense amplifier which incorporates feedback to a charged sense node. This allows for the rapid charging and discharging necessary to maintain a predetermined signal level. The sense amplifier uses a feedback circuit to control the potential drop of the bit line.

U.S. Pat. No. 4,434,381, entitled Sense Amplifiers, issued to R. G. Stewart, discloses a sense amplifier and concepts related to precharging and setting of sensing transitions. This circuit requires the use of a relatively high number of devices.

U.S. Pat. No. 4,567,387, entitled Linear Sense Amplifier, issued to I. T. Wacyk, discloses a sense amplifier that adds a bias current to the current delivered by the memory device.

U.S. Pat. No. 4,574,365, entitled Shared Access Lines Memory Cells, issued to R. E. Scheuerlein, discloses shared sense amplifiers for coupled memory cells. The memory cells are read out using a sense line, a first and a second bit line.

U.S. Pat. No. 4,970,689, entitled Charge Amplifying Trench Memory Cell, issued to Donald M. Kenney on Nov. 13, 1990, discloses a memory cell with a storage node that is not directly connected to the bit line during a read. The circuit requires two data lines for writing and reading.

U.S. Pat. No. 5,015,890, entitled Sense Amplifier Having Pull-up Circuit Controlled By Feedback, issued to Hiroaki Murakami et al. on May 14, 1991, discloses a sense amplifier for a low signal generated by a conventional memory cell.

U.S. Pat. No. 5,015,891, entitled Output Feedback Control Circuit For Integrated Circuit Device, issued to Yun-ho Choi on May 14, 1991, discloses a sense amplifier consisting of a read driver and an output latch transition block which utilizes a high device count.

U.S. Pat. No. 5,138,198, entitled Integrated Programmable Logic Device With Control Circuit To Power Down Unused Sense Amplifiers, issued to Ju Shen et al. on Aug. 11, 1992, discloses a logic device which powers down sense amplifiers that are not in use.

A problem typically associated with a sense amplifier for a gain memory cell is that of a relatively high component count. The high component count inflicts a cost and size penalty in the memory circuit and thus limits the operating speed and the density of the memory circuit.

It is, therefore, desirable to reduce the component count for a sense amplifier for a gain memory cell.

Another problem with sense amplifiers for gain memory cells is their power consumption both in the active mode and in the stand by mode. This power consumption limits the memory circuit density because of heat dissipation limitations as well as increases the power supply capacity requirements. It is desirable to minimize the power consumption of a sense amplifier for a gain memory cell in both the active mode and the stand by mode of operation.

It is, therefore, an object of the present invention to provide a sense amplifier which reduces power consumption.

It is a further object of the present invention to provide a sense amplifier capable of very fast sensing of the output signals of gain memory cells.

SUMMARY OF THE INVENTION

The present invention is a low power sense amplifier to sense the output of any memory cell which delivers a signal charge in one logical state and substantially no charge in the other logical state, and is especially suited for use with gain memory cells. The present invention low power sense amplifier circuit is based on an inverter with a feedback loop with additional circuitry providing stability after signal sensing. The bit sense line is discharged before sensing and after sensing it is locked to either a logical "0" or a logical "1" corresponding to the logical value of the gain memory cell during the read sensing cycle. The sense amplifier provides a logic output that is well defined with respect to the supply voltage and corresponds to the logic value of the gain memory cell. The present invention low power sense amplifier has no bias current flow during signal sensing and no power consumption in the stand by mode. The present invention low power sense amplifier is capable of being shared by two bit sense lines. The low power sense amplifier has a relatively low component count which allows for greater memory density and for the amplifier to be capable of very fast sensing of the output signals.

The present invention low power sense amplifier can be used for a gain memory cell operative in a first state for storing a logical 1 and in a second state for storing a logical 0 wherein the gain memory cell is activated by applying a signal to a control line so that the gain memory cell applies a stored potential to a bit line, the stored potential indicative of a first potential level that corresponds to a stored logical 1 and a second potential level that corresponds to a stored logical 0. The sense amplifier comprises a preliminary discharge means, an actuatable sense amplifier means and an activation means. The preliminary discharge means is coupled to the bit line, for discharging the bit line prior to sensing. The actuatable sense amplifier means is responsive to an actuation control signal to sense a level on the bit line and provide an output signal. The sense amplifier means is coupled to the bit line. The sense amplifier means has a first conductive state in response to the first potential level and a second nonconductive state in response to the second potential level on the bit line. The activation means is coupled to the control line of the memory gain cell so that the gain memory cell applies the stored potential level to the bit line and for activating the actuatable sense amplifier means to sense the bit line. Wherein the output signal of the actuatable sense amplifier means is operative in the first state when the gain memory cell contains the stored logical 1 and in the second state when the gain memory cell contains the stored logical 0.

BRIEF DESCRIPTION OF THE FIGURES

The above objects and further features and advantages of the invention are described in detail below in conjunction with the drawing, of which:

FIG. 1 shows a schematic diagram of a low power sense amplifier with an optional second bit sense line;

DETAILED DESCRIPTION OF THE INVENTION

Figure 2A:
FIG. 2A shows a timing diagram for a read sensing cycle of first bit discharge line.
Figure 2B:
FIG. 2B shows a timing diagram for a read sensing cycle of hold line.
Figure 2C:
FIG. 2C shows a timing diagram for a read sensing cycle of supply line.
Figure 2D:
FIG. 2D shows a timing diagram for a read sensing cycle of output precharge line.
Figure 2E:
FIG. 2E shows a timing diagram for a read sensing cycle of control line.

Although the present invention low power sense amplifier can be used to sense the outputs of any memory cell which delivers a signal charge in one logical state and substantially no charge in the other logical state, having only a small voltage difference between both logic states, the present invention is especially suited for use with gain memory cells. Accordingly the present invention low power sense amplifier will be described below in the context of a gain memory cell application in order to describe the best mode of the invention.

Referring to FIG. 1 there is shown a preferred embodiment of the present invention low power sense amplifier 10 connected to a gain memory cell 14 with a secondary sense amplifier 12 and timing signal generator 52.

The timing signal generator 52 provides the signals which are connected to the first bit discharge line 32, the hold line 36, the supply line 38, the output precharge line 40, the control line 42 and the word line. The sequence of the signals are shown in FIG. 2 and their functionality is explained later.

The low power sense amplifier 10 is implemented utilizing two pMOS transistors 16 and 18 and five nMOS transistors 20, 22, 24, 26 and 28. A first bit sense line 30 from the gain memory cell 14 is commonly interconnected to the drain of nMOS transistor 20, the drain of nMOS transistor 22, the gate of nMOS transistor 26, and the drain of pMOS transistor 16. A first bit discharge line 32 is coupled to the gate of nMOS transistor 20. The source of nMOS transistor 20 is coupled to ground 34. The source of nMOS transistor 22 is coupled to the drain of nMOS transistor 24. A hold line 36 is coupled to the gate of nMOS transistor 24. The source of nMOS transistor 24 and the source of nMOS transistor 26 are coupled to ground 34. A supply line 38 is coupled to the source of pMOS transistor 16 and the source of pMOS transistor 18. An output precharge line 40 is coupled to the gate of pMOS transistor 18. The gate of pMOS transistor 16, the gate of nMOS transistor 22, the drain of pMOS transistor 18, the drain of nMOS transistor 26, and the drain of nMOS transistor 28 are commonly interconnected. A control line 42 is connected to the gate of pMOS transistor 28.

A secondary sense amplifier 12 has a read data line 44, a word data line 46 and a R/W line 48. The read data line 44 is connected to the source of nMOS transistor 28.

The secondary sense amplifier 12 can be a current sensitive differential amplifier connected to the read data line 44 and a reference current source or a voltage differential amplifier connected to the read data line 44 and a reference voltage source. The designs of a current sensitive differential amplifier and a voltage differential amplifier are well known to those ordinarily skilled in the art.

FIG. 2 shows the timing of input signals from the first bit discharge line 32 (FIG. 2A), the hold line 36 (FIG. 2B), the supply line 38 (FIG. 2C), the output precharge line 40 (FIG. 2D), the control line 42 (FIG. 2E) and the word line (FIG. 2F) during a read sensing cycle.

Referring back to FIG. 1 in conjunction with FIG. 2, the functioning of the low power sense amplifier 10 in relationship to the sequence of input signals will be explained. The input signals are generated by a timing signal generator 52. The timing signal generator 52 is constructed from logic gates and timers, electronic components that are well known in the art and can be selected by a person of ordinary skill in the art and from readily available commercial sources. The first bit discharge line 32 (FIG. 2A) becomes HIGH and turns nMOS transistor 20 ON which shunts the first bit sense line 30 to ground 34. A voltage source $V_{DD}$ is applied to the supply line 38 (FIG. 2C) which turns ON the low power sense amplifier 10 for sensing the signal of a gain memory cell.

The first bit discharge line 32 (FIG. 2A) now becomes LOW which causes the first bit sense line 30 to float. At the same time, the output precharge line 40 (FIG. 2D) becomes LOW and turns ON pMOS transistor 18 which shunts the drain of nMOS transistor 26 and the commonly connected component terminals to the supply line 38 (FIG. 2C) which has a voltage source $V_{DD}$ currently applied to it.

Figure 2F:
FIG. 2F shows a timing diagram for a read sensing cycle of word line.

The output precharge line 40 (FIG. 2D) now becomes HIGH and turns OFF pMOS transistor 18 which causes the drain of nMOS transistor 26 and the commonly connected component terminals to float. The gain memory cell 14 is now activated for sensing by turning ON an appropriate word line (FIG. 2F).

When the gain memory cell 14 has the value of logical "0" no charge is supplied to the first bit sense line 30 which therefore remains LOW and causes the nMOS transistor 26 to remain OFF, the drain of nMOS transistor 26 remains charged, pMOS transistor 16 remains OFF and nMOS transistor 22 remains ON.

When the hold line 36 (FIG. 2B) becomes HIGH, nMOS transistor 24 is turned ON. Because nMOS transistor 22 is already ON the first bit sense line 30 is shunted to ground 34. This causes the first bit sense line 30 to remain stable with a LOW value for the duration of the sensing cycle.

When the gain memory cell 14 has the value of logical "1" charge is supplied to the first bit sense line 30 which becomes HIGH and causes nMOS transistor 26 to turn ON. This causes the drain of nMOS transistor 26 to become LOW which turns nMOS transistor 22 OFF and pMOS transistor 16 ON which locks the first bit sense line 30 HIGH.

When the hold line 36 (FIG. 2B) becomes HIGH, nMOS transistor 24 is turned ON. However, because nMOS transistor 22 is OFF the first bit sense line 30 is not shunted to ground 34.

The low power sense amplifier 10 has two primary modes, an active mode and a stand by mode. The low power sense amplifier 10 is in the stand by mode when the supply line 38 (FIG. 2C) is disconnected from the voltage source $V_{DD}$ or when the supply line 38 (FIG. 2C) is connected to ground 34. When operated in the stand by mode no power is consumed by the low power sense amplifier 10.

Before the signal from the low power sense amplifier 10 is transferred to the secondary sense amplifier 12 the read data line 44 is precharged with voltage source $V_{DD}$. Then the control line 42 (FIG. 2E) becomes HIGH and nMOS transistor 28 is turned ON which connects the low power sense amplifier 10 to the read data line 44. If the signal from the low power sense amplifier 10 has the value of logical "1" the read data line 44 remains HIGH. If the signal from the low power sense amplifier 10 has the value of logical "0" the read data line 44 is discharged and made LOW.

Referring back to FIG. 1 there is shown an optional second bit sense line 50. The addition of the second bit sense line 50 reduces in half the number of low power sense amplifiers for a gain memory cell 14 array. However, the second bit sense line 50 represent a greater capacitive load to the low power sense amplifier 10. This increased capacitive load requires an increase of the channel size in nMOS transistor 20 and pMOS transistor 16 in order to provide the necessary increase in current.

Figure 3:
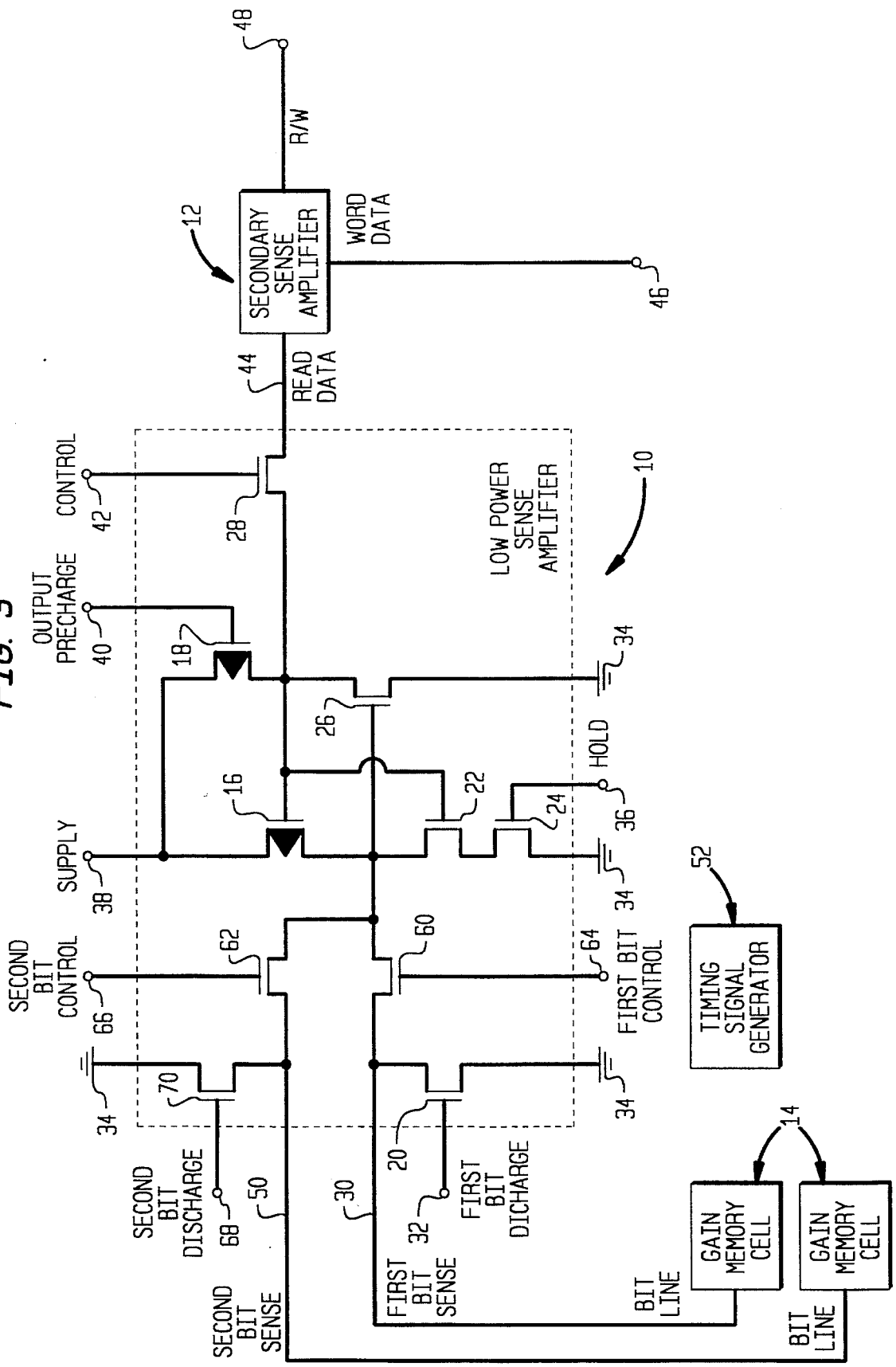
FIG. 3 shows a schematic diagram of a low power sense amplifier shared between two bit sense lines with bit sense line switches.

Referring to FIG. 3 there is shown an alternate embodiment of the low power sense amplifier 10. The same reference numbers used in FIG. 1 have been retained to refer to the same components. The source and the drain of nMOS transistor 60 is connected in series with the first bit sense line 30. The source and the drain of nMOS transistor 62 is connected in series with the second bit sense line 50. A first bit control line 64 is connected to the gate of nMOS transistor 60. A second bit control line 66 is connected to the gate of nMOS transistor 62. The drain of nMOS transistor 70 is connected to the second bit sense line 50. Second bit discharge line 68 is connected to the gate of nMOS transistor 70. The source of nMOS transistor 70 is connected to ground 34.

The functioning of the alternate embodiment of the low power sense amplifier 10 shown in FIG. 3 in relationship to the sequence of input signals is the same as described for the low power sense amplifier 10 shown in FIG. 1 except for the selection of the first bit sense line 30 or the second bit sense line 50 and the precharging of the corresponding bit sense line. The timing signal generator 52 provides the first bit control signal 64, the second bit control signal 66, and the second bit precharge signal 68. When the first bit control line 64 is HIGH, nMOS transistor 60 is turned ON to connect first bit sense line 30. When the second bit control line 66 is HIGH, nMOS transistor 62 is turned ON to connect second bit sense line 50.

When the first bit sense line 30 is selected, the first bit sense line 30 is discharged as described before. When the second bit sense line 50 is selected, the second bit discharge line 68 becomes HIGH to turn nMOS transistor 70 ON which shunts the second bit sense line 50 to ground 34. Further, after the second bit sense line 50 has been discharged, the second bit discharge line 68 becomes LOW to causes the second bit sense line 50 to float.

The alternate embodiment of the low power sense amplifier 10 reduces the capacitive load by disconnecting either the first bit sense line 30 or the second bit sense line 50. Therefore, an increase of the channel size in nMOS transistor 20 and pMOS transistor 16 is not required.

However, with the alternate embodiment of the low power sense amplifier 10 it is necessary for the gate of nMOS transistor 60 and the gate of nMOS transistor 62 to be boosted in order to pass the full level of the signal from the corresponding bit sense line.

Figure 4:
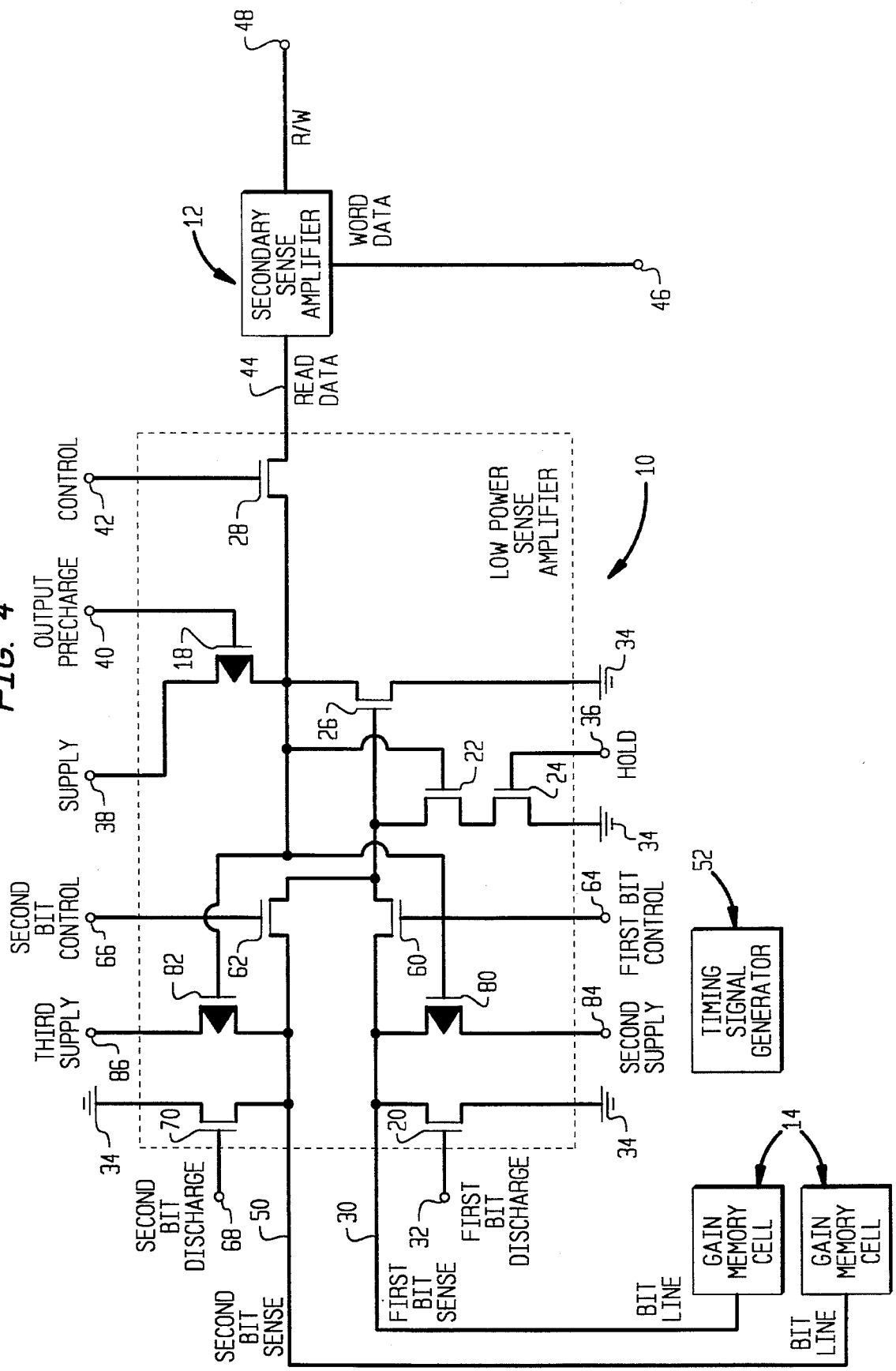
FIG. 4 shows a schematic diagram of a low power sense amplifier shared by two bit sense lines with bit sense line switches and separate pull-up transistors.

Referring to FIG. 4 there is shown an alternate third embodiment of the low power sense amplifier 10. The same reference numbers used in FIG. 1 and in FIG. 3 have been retained to refer to the same components. The timing signal generator 52 provides the second supply signal 84 and the third supply signal 86. In the alternate third embodiment of the low power sense amplifier 10 the pMOS transistor 16 shown in FIG. 3. has been replaced by separate pMOS transistors 80 and 82. The drain of pMOS transistor 80 is connected to the first bit sense line 30. The drain of pMOS transistor 82 is connected to the second bit sense line 50. The source of pMOS transistor 80 is connected to a second supply line 84. The source of pMOS transistor 82 is connected to a third supply line 86. The gate of pMOS transistor 80 and the gate of pMOS transistor 82 are connected in common with the drain of pMOS transistor 18, the drain of nMOS transistor 26, the drain of nMOS transistor 28 and the gate of nMOS transistor 22.

The functioning of the alternate third embodiment of the low power sense amplifier 10 shown in FIG. 4 in relationship to the sequence of input signals is the same as described for the low power sense amplifier 10 shown in FIG. 3 except for the second supply line 84 and the third supply line 86. The voltage source $V_{DD}$ is applied to the second supply line 84 when the first bit sense line 30 is selected as previously described. The voltage source $V_{DD}$ is applied to the third supply line 86 when the second bit sense line 50 is selected as previously described.

With the alternate third embodiment of the low power sense amplifier 10 shown in FIG. 4 it is not necessary for the gate of nMOS transistor 60 or the gate of nMOS transistor 62 to be boosted in order to pass the full level of the signal from the corresponding bit sense line as was necessary with the low power sense amplifier Shown in FIG. 3.

Figure 5:
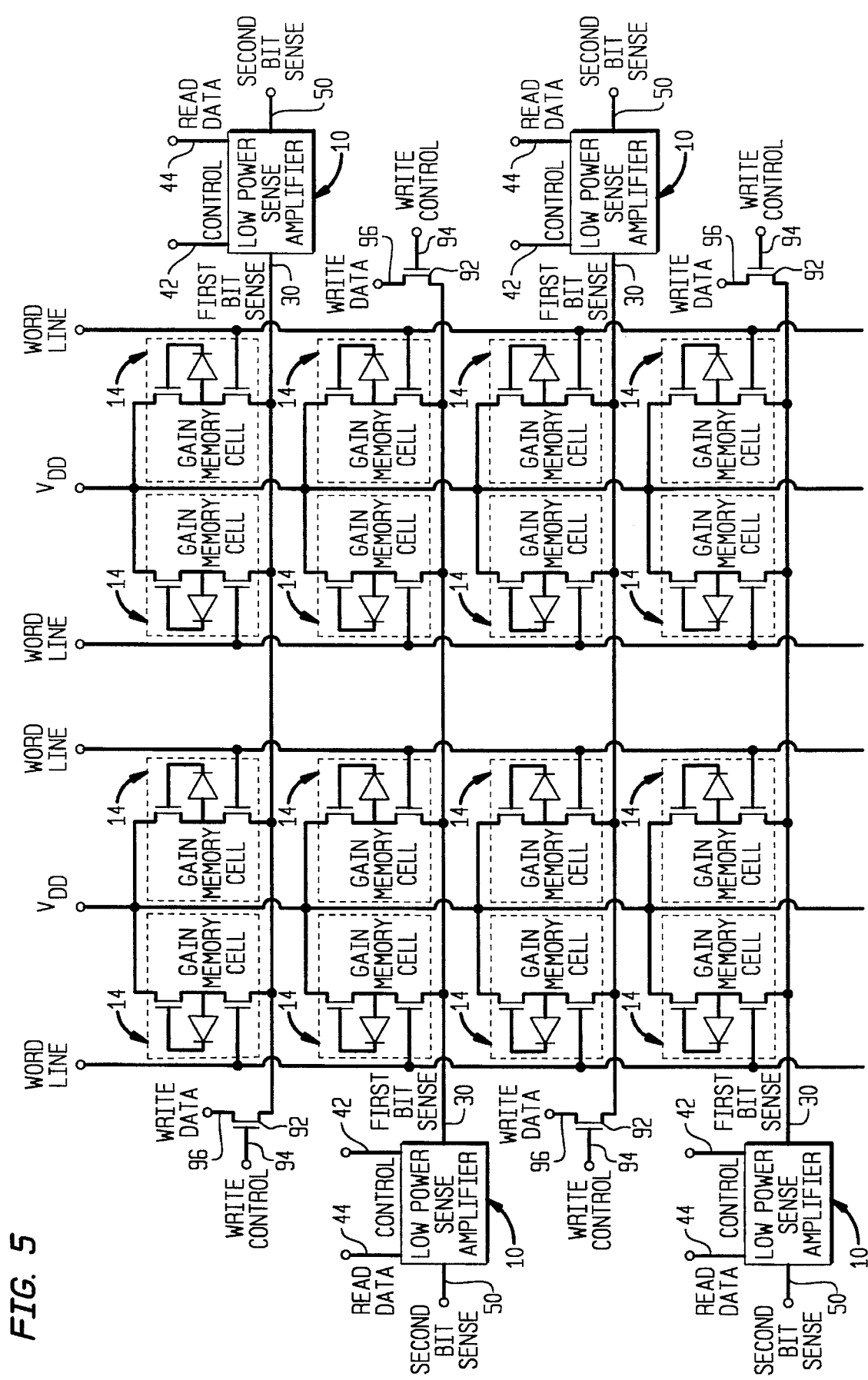
FIG. 5 shows a schematic diagram of a low power sense amplifiers connected to an array of gain memory cells.

Referring to FIG. 5 there are shown four low power sense amplifiers 10 connected to an array of gain memory cells 14. The same reference numbers used in FIG. 1 have been retained to refer to the same components. The low power sense amplifier 10 has a first bit sense line 30, a second bit sense line 50, a control line 42, and a read data line 44. The first bit sense line 30 is connected to the array of gain memory cells 14. The connection to the second bit sense line 50 to another part of the array of the gain memory cells 14 is not shown for simplicity. The source and the drain of nMOS transfer transistor 92 is connected between the write data line signal 96 and the array of gain memory cells 14. The gate of the nMOS transfer transistor 92 is connected to the write control line 94.

Writing into the gain memory cells 14 is accomplished by control of the read data line 44 by the control line 42 or by directly applying the write data line signal 96 to the bit sense line by the appropriate transfer transistor 92 by write control line 94. This results in a very short writing cycle time.

It should be understood that the embodiments described herein are merely exemplary and that a person skilled in the art may make variations and modifications without departing from the spirit and scope of the invention. All such variations and modifications are intended to be included within the scope of the invention as defined in the appended claims.

What is claimed is:

1. A sense amplifier, for a gain memory cell operative in a first state for storing a logical 1 and in a second state for storing a logical 0 wherein the gain memory cell is activated by applying a signal to a control line so that the gain memory cell applies a stored potential to a bit line, the stored potential indicative of a first potential level that corresponds to a stored logical 1 and a second potential level that corresponds to a stored logical 0, comprising:

preliminary discharge means, coupled to the bit line, for discharging the bit line prior to sensing;

actuatable sense amplifier means responsive to an actuation control signal to sense a level on the bit line and provide an output signal, said sense amplifier means coupled to the bit line, said sense amplifier means including feedback means for ensuring a full potential level back to the bit line for each of the first potential level and second potential level, said amplifier means having a first conductive state in response to the first potential level and a second nonconductive state in response to the second potential level on the bit line;

activation means coupled to the control line of the (memory) gain memory cell so that the gain memory cell applies the stored potential level to the bit line and for activating said actuatable amplifier means to sense the bit line;

wherein said output signal of said actuatable sense amplifier means is operative in said first state when the gain memory cell contains the stored logical 1 and in said second state when the gain memory cell contains the stored logical 0.

2. The sense amplifier as recited in claim 1, wherein said preliminary discharge means comprises an nMOS transistor having a source, a drain and a gate electrode, with said source electrode adapted to receive a first potential, said drain electrode coupled to the bit line, and said gate electrode coupled to a preliminary discharge control line.

3. The sense amplifier as recited in claim 1 further comprising switching means adapted to receive said output signal of said actuatable sense amplifier means for providing a switched output signal in response to a switch control signal.

4. The sense amplifier as recited in claim 3, wherein said switching means comprises an nMOS transistor having a source, a drain and a gate electrode, with said drain electrode adapted to receive said output signal of said actuatable sense amplifier means, said gate electrode adapted to receive a switch control signal.

5. The sense amplifier as recited in claim 1, wherein said actuatable sense means further comprises:

a first nMOS transistor, having a drain, a source and a gate electrode, said gate electrode coupled to the bit line, said source electrode coupled to a first potential;

a second nMOS transistor, having a drain, a source and a gate electrode, said drain electrode coupled to the bit line;

a third nMOS transistor, having a drain, a source and a gate electrode, said drain electrode coupled to said source electrode of said second nMOS transistor, said source electrode coupled to said first potential, said gate adapted to receive a hold signal;

a first pMOS transistor having a drain, source and a gate electrode, said source electrode coupled to a second potential, said drain electrode coupled to the bit line;

a second pMOS transistor, having a drain, a source and a gate electrode, said source electrode coupled to said second potential, said gate electrode adapted to receive a precharge signal;

an output line commonly coupled to said gate electrode of said first pMOS transistor, said drain electrode of said second pMOS transistor, said gate electrode of said second nMOS transistor, and said drain electrode of said first nMOS transistor.

6. The sense amplifier as recited in claim 5 wherein said sense amplifier has an active mode and a stand by mode, wherein said second potential is equivalent to said first potential in said stand by mode, whereby said sense amplifier utilizes no power in said stand by mode.

7. A sense amplifier, for a plurality of gain memory cells, each gain memory cell operative in a first state for storing a logical 1 and in a second state for storing a logical 0 wherein the gain memory cell is activated by applying a signal to a control line so that the gain memory cell applies a stored potential to a bit line, the stored potential indicative of a first potential level that corresponds to a stored logical 1 and a second potential level that corresponds to a stored logical 0, comprising:

a shared bit line commonly interconnected to the bit line of each gain memory cell of the plurality of gain memory cells;

preliminary discharge means, coupled to the bit line, for discharging said shared bit line prior to sensing;

actuatable sense amplifier means responsive to an actuation control signal to sense a level on said shared bit line and provide an output signal, said sense amplifier means coupled to said shared bit line, said sense amplifier means including feedback means for ensuring a full potential level back to said shared bit line for each of the first potential level and second potential level, said sense amplifier means having a first conductive state in response to the first potential level and a second nonconductive state in response to the second potential level on said shared bit line;

activation means coupled to the control line of a selected one of the plurality gain memory cells so that said selected one of the plurality gain memory cells applies the stored potential level to (the) said Shared bit line and for activating said actuatable amplifier means to sense (the) said shared bit line;

wherein said output signal of said actuatable sense amplifier means is operative in said first state when said selected one of the plurality of gain memory cells contains the stored logical 1 and in said second state when said selected one of the plurality of gain memory cells contains the stored logical 0.

8. The sense amplifier as recited in claim 7, wherein said discharge means comprises an nMOS transistor having a source, a drain and a gate electrode, with said source electrode coupled to a first potential, said drain electrode coupled to said shared bit line, and said gate electrode adapted to receive a preliminary discharge control signal.

9. The sense amplifier as recited in claim 7 further comprising switching means adapted to receive said output signal of said actuatable sense amplifier means for providing a switched output signal in response to a switch control signal.

10. The sense amplifier as recited in claim 9, wherein said switching means comprises an nMOS transistor having a source, a drain and a gate electrode, wherein said drain electrode adapted to receive said output signal, said gate electrode adapted to receive a switch control signal.

11. The sense amplifier as recited in claim 7, wherein said actuatable sense means further comprises:

a first nMOS transistor, having a drain, a source and a gate electrode, said gate electrode coupled to said shared bit line, said source electrode coupled to a first potential;

a second nMOS transistor, having a drain, a source and a gate electrode, said drain electrode coupled to said shared bit line;

a third nMOS transistor, having a drain, a source and a gate electrode, said drain electrode coupled to said source electrode of said second nMOS transistor, said source electrode coupled to said first potential, said gate adapted to receive a hold signal;

a first pMOS transistor having a drain, source and a gate electrode, said source electrode coupled to a second potential, said drain electrode coupled to said shared bit line;

a second pMOS transistor, having a drain, a source and a gate electrode, said source electrode coupled to said second potential, said gate electrode adapted to receive a precharge signal;

an output line commonly coupled to said gate electrode of said first pMOS transistor, said drain electrode of said second pMOS transistor, said gate electrode of said second nMOS transistor, and said drain electrode of said first nMOS transistor.

12. The sense amplifier as recited in claim 11 wherein said sense amplifier has an active mode and a stand by mode, wherein said second potential is equivalent to said first potential in said standby mode, whereby said sense amplifier utilizes no power in said stand by mode.

13. The sense amplifier as recited in claim 7, wherein said shared bit line is interconnected to the bit line of each gain memory cell of the plurality of gain memory cells by a plurality of switching means for switching said interconnection.

14. The sense amplifier as recited in claim 13, wherein a plurality of discharge means is connected to the bit line of each one of the gain memory cells of the plurality of gain memory cells before said active switching means.

15. The sense amplifier as recited in claim 13, wherein each of said plurality of switching means comprises an nMOS transistor having a drain, a source, and a gate electrode, said source electrode coupled to the bit line of one of the gain memory cells of the plurality of gain memory cells, said drain electrode coupled to said shared bit line, and said gate electrode adapted to receive a bit control signal.

16. The sense amplifier as recited in claim 14, wherein each of said plurality of active discharge means comprises an nMOS transistor having a source, a drain and a gate electrode, wherein said source electrode coupled to a first potential, said drain electrode coupled to the bit line of one of the plurality of gain memory cells, and said gate electrode adapted to receive a preliminary discharge control signal.

17. The sense amplifier as recited in claim 7, wherein said plurality of gain memory cells commonly interconnected to said shared bit line comprises two gain memory cells.

18. A method for sensing a gain memory cell operative in a first state for storing a logical 1 and in a second state for storing a logical 0 wherein the gain memory cell is activated by applying a signal to a memory control line so that the gain memory cell applies a stored potential to a bit line, the potential operative in a first state that corresponds to the stored logical 1 and a second state that corresponds to the stored logical 0, the method comprising the steps of:

first discharging the bit line in response to a control signal;

applying a signal to the memory control line so that the gain memory cell applies the potential to the bit line;

secondly discharging the bit line after the potential is applied to the bit line, then activating feedback means for ensuring a full potential level back to the bit line for the potential operative in each of the first state and second state, and then enabling a conductive state in response to the first state of the potential and enabling a nonconductive state in response to the second state of the potential;

providing an output signal operating in a first state indicative of a binary 1 when the gain memory cell contains the stored logical 1 and in a second state indicative of a binary 0 when the gain memory cell contains the stored logical 0.

19. The method as recited in claim 18 further comprising the step of latching said output signal for a predetermined period.

20. The method as recited in claim 18 wherein the step of first discharging the bit line in response to a control signal comprises an nMOS transistor having a source, a drain and a gate, wherein said source connected to a first potential, said drain connected to the bit line, and said gate connected to a preliminary discharge control line.

* * * * *

UNITED STATES PATENT AND TRADEMARK OFFICE
CERTIFICATE OF CORRECTION

PATENT NO. : 5,610,540
DATED : March 11, 1997
INVENTOR(S) : Althoff et al.

It is certified that error appears in the above-indentified patent and that said Letters Patent is hereby corrected as shown below:

<u>Column 7, line 57</u> delete "(memory)"

<u>Column 9, line 10</u> delete "(the)"

<u>Column 9, line 12</u> delete "(the)"

Signed and Sealed this

Twenty-third Day of September, 1997

Attest:

BRUCE LEHMAN

Attesting Officer

Commissioner of Patents and Trademarks